(12) United States Patent
Nair et al.

(10) Patent No.: US 6,229,357 B1
(45) Date of Patent: May 8, 2001

(54) FREQUENCY DIVIDER AND METHOD

(75) Inventors: Rajendran Nair, Hillsboro; Siva G. Narendra, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/388,562

(22) Filed: Sep. 2, 1999

(51) Int. Cl.[7] .................................................. H03B 19/00
(52) U.S. Cl. ........................................ 327/115; 327/118
(58) Field of Search .................................. 327/113, 115, 327/117; 377/47, 48

(56) References Cited

U.S. PATENT DOCUMENTS

| | | | |
|---|---|---|---|
| 5,111,489 | * 5/1992 | Tanaka et al. | 377/121 |
| 5,359,232 | * 10/1994 | Eitrheim et al. | 377/47 |
| 5,684,418 | * 11/1997 | Yanagiuchi | 327/99 |
| 6,031,429 | * 2/2000 | Shen | 331/17 |

* cited by examiner

Primary Examiner—Tuan T. Lam
(74) Attorney, Agent, or Firm—Schwegman, Lundberg, Woessner & Kluth, P.A.

(57) ABSTRACT

A frequency divider includes a pulse generator, a latch with differential outputs, and switches responsive to the state of the latch. The latch changes logical state in response to signal pulses produced by the pulse generator. The signal pulses are produced by the pulse generator in response to rising edges of an input signal applied to the pulse generator. A first output alignment circuit provides additional drive strength to a first of the differential outputs when it is transitioning high. A second output alignment circuit provides additional drive strength to a second of the differential outputs when it is transitioning high.

29 Claims, 8 Drawing Sheets

FREQUENCY DIVIDER AND METHOD

TECHNICAL FIELD OF THE INVENTION

The present invention relates generally to electronic systems using high frequency signals, and in particular, the present invention relates to frequency dividers.

BACKGROUND OF THE INVENTION

Frequency dividers are used in many electronic systems to produce signals having frequencies lower than those already existing. For example, if a 100 Megahertz (MHZ) signal exists in a system, but a 50 MHZ signal is desired, a frequency divider that divides the frequency by two can be employed.

FIG. 1 shows a prior art frequency divider that divides an input signal frequency by two. Prior art frequency divider 100 includes D-type flip flop 110 and inverter 115. The input signal is applied to the clock input of D-type flip flop 110, which transitions the logical state of the Q output to be equal to the logical state of the D input when the input signal transitions from low to high. Inverter 115 applies to the D input a signal that is opposite in logical state to the Q output, so that the Q output changes logical state in response to the rising edge of the input signal. This results in an output signal with a frequency that is one half of the input signal frequency.

Prior art frequency dividers have maximum operating frequencies, beyond which operation is not reliable. One problem with prior art frequency dividers is low maximum operating frequencies. For the reasons stated above, and for other reasons stated below which will become apparent to those skilled in the art upon reading and understanding the present specification, there is a need for alternate methods and apparatus for dividing the frequency of signals.

SUMMARY OF THE INVENTION

In one embodiment, a frequency divider is described. The frequency divider includes a pulse generator that has an input node coupled to an input of the frequency divider. The pulse generator also has an output node, and is configured to provide signal pulses on the output node. The frequency divider further includes a latch coupled to the output node of the pulse generator. The latch has a logical state, and is configured to change logical state in response to the signal pulses.

In another embodiment, a phase lock loop is described. The phase lock loop includes a phase comparator coupled to an input of the phase lock loop, an oscillator responsive to the phase comparator, and a frequency divider. The frequency divider includes a pulse generator and a latch, the latch being configured to change logical state in response to signal pulses produced by the pulse generator.

In another embodiment, an integrated circuit is described. The integrated circuit includes an input node configured to receive an input signal having a frequency and multiple periods, and also includes a frequency divider for dividing the frequency of the input signal. The frequency divider includes a pulse generator configured to produce a pulsed signal having one pulse for each of the periods, and also includes a latch having a logical state. The latch is configured to change the logical state in response to each pulse on the pulsed signal.

In another embodiment, a method of dividing the frequency of an input signal is described. The method includes detecting an edge of the input signal, producing a pulsed signal in response to the edge, and changing a logical state of a latch in response to the pulsed signal.

DETAILED DESCRIPTION OF THE INVENTION

Figure 1:
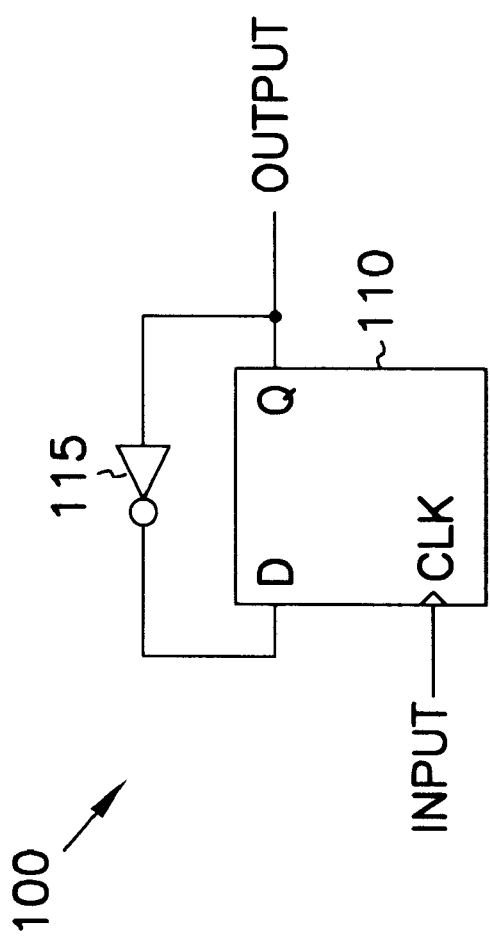
FIG. 1 is a prior art frequency divider circuit.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Various embodiments of circuits are described with reference to circuit nodes having logical states of logical "1" and logical "0." Circuit nodes are also described as having high voltage and low voltage signals applied thereto. The terms logical "1" and logical "0" generally correspond to a high voltage and a low voltage, respectively. The "logical" terms are used when describing the logical operation of a circuit, and the "voltage" terms are used when describing the circuit more fully. One skilled in the art will understand that a logical inversion can take place while still practicing the present invention. A logical inversion would exist if the terms logical "1" and logical "0" corresponded to a low voltage and a high voltage, respectively.

Figure 2:
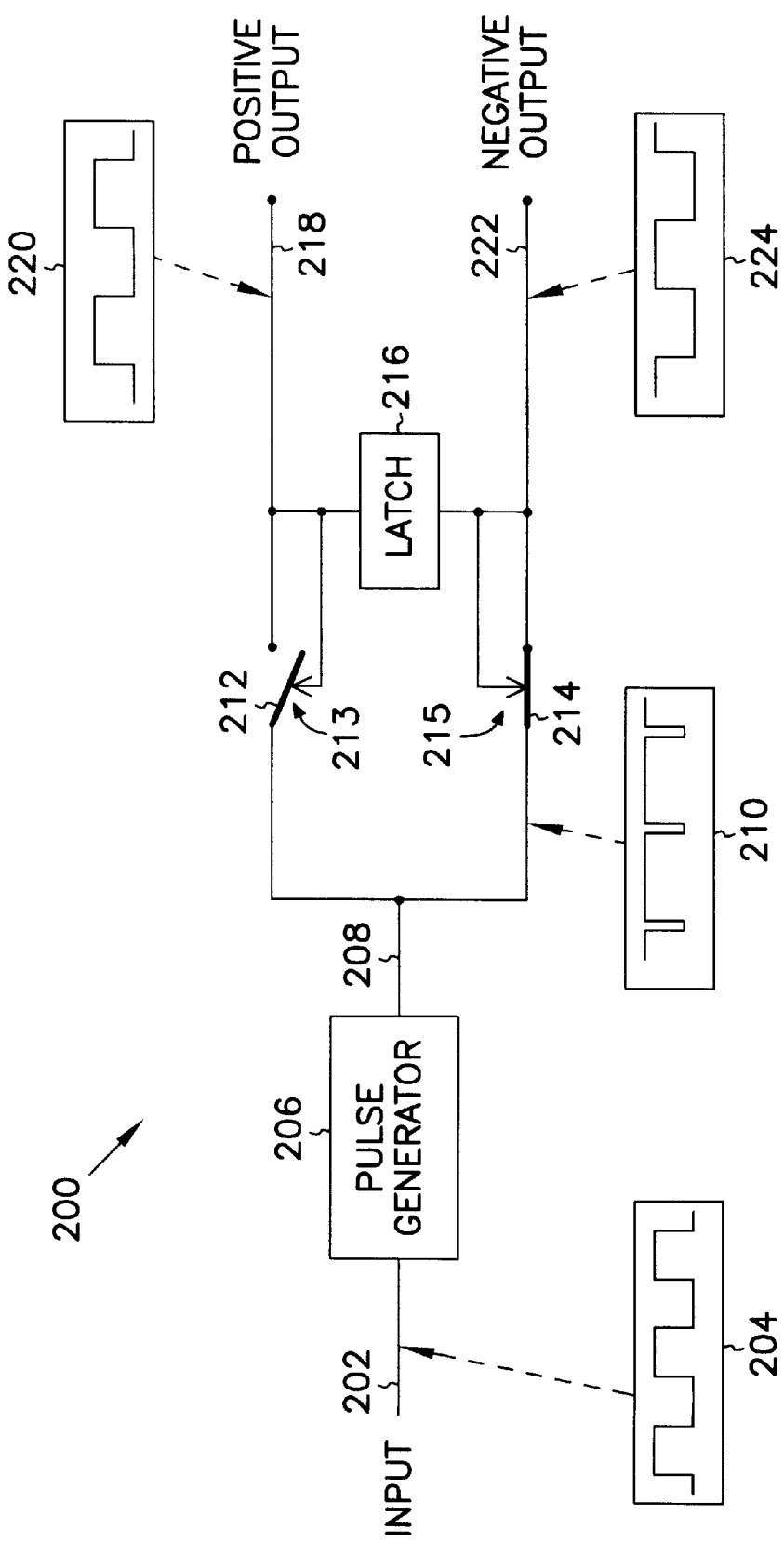
FIG. 2 is a diagram of a frequency divider circuit.

FIG. 2 shows a diagram of a frequency divider circuit in accordance with an embodiment of the present invention. Frequency divider circuit 200 includes pulse generator 206, latch 216, and switches 212 and 214. A signal is input at input node 202. Input node 202 is a node which is capable of receiving an input signal, and providing it to pulse generator 206. For the purpose of explaining the operation of frequency divider circuit 200, input signal 204 is shown impressed on input node 202. For explanatory purposes, input signal 204 is shown as a square wave, however one skilled in the art will recognize that signals having forms other than square waves can be used as input signals. In particular, as the frequency of input signal 204 increases, input signal 204 may approach a shape other than a square wave.

Signal path 208 couples the output of pulse generator 206 to switches 212 and 214. Pulsed signal 210 is shown impressed on signal path 208. Pulsed signal 210 is an example of a signal that results when input signal 204 is impressed on input node 202 as previously described. Pulsed signal 210 has one negative pulse for each rising edge of input signal 204. The duration of the negative pulses on pulsed signal 204 is determined in part by pulse generator 206, an embodiment of which is more fully described with reference to FIG. 3 below.

Frequency divider circuit 200 has differential outputs which include a first divider output node and a second divider output node. In the embodiment shown in FIG. 2, the first divider output node is positive output 218, and the second divider output node is negative output 222. Latch 216 is disposed between the differential outputs, such that latch 216 has two nodes, one being coupled to positive output 218, and the other being coupled to negative output 222. Latch 216 is a device capable of storing a logical state, such as a logical "1" or a logical "0." The two nodes coupled to latch 216 have opposite logical states. For example, when latch 216 is storing a "1," positive output 218 has imposed thereon a signal that has a high voltage, and negative output 222 has imposed thereon a signal that has a low voltage. An example positive output signal is shown as positive output signal 220, and an example negative output signal is shown as negative output signal 224. As latch 216 changes logical states, the positive and negative output signals are produced on the outputs as shown in FIG. 2.

Latch 216 is responsive to the negative signal pulses produced by pulse generator 206. When a negative signal pulse is generated on signal path 208 by pulse generator 206, latch 216 changes logical state. As previously described, one signal pulse is generated for each rising edge of the input signal, which occurs once per period of the input signal. Latch 216 changes logical state for each signal pulse, which corresponds to the latch changing logical state once per period of the input signal. This yields an output signal having a period substantially twice that of the input signal. Stated differently, the output signal is substantially half the frequency of the input signal.

Switch 212 can be open or closed depending on the logical state of control input 213. Likewise, switch 214 can be open or closed depending on the logical state of control input 215. In one embodiment, switches 212 and 214 are field effect transistors (FETs), and control inputs 213 and 215 are gates of the FETs. Positive output 218 is coupled to control input 213 of switch 212, and negative output 222 is coupled to control input 215 of switch 214. In this circuit arrangement, the logical state of latch 216 determines whether switches 212 and 214 are open or closed. For example, when latch 216 stores a logical "1," control input 213 of switch 212 has a logical "1" imposed thereon, and switch 212 is closed; and control input 215 of switch 214 has a logical "0" imposed thereon, and switch 214 is open. When latch 216 stores a logical "0," control input 213 of switch 212 has a logical "0" imposed thereon, and switch 212 is open; and control input 215 of switch 214 has a logical "1" imposed thereon, and switch 214 is closed.

In operation, when frequency divider circuit 200 is in steady-state, one of positive output 218 and negative output 222 is coupled to signal path 208 at a time. For example, in the steady-state shown in FIG. 2, latch 216 is storing a logical "0," switch 212 is open, and switch 214 is closed. Accordingly, negative output 222 has a logical "1" imposed thereon, and positive output 218 has a logical "0" imposed thereon.

When pulse generator 206 generates the next negative signal pulse on signal path 208, the signal pulse propagates to latch 216 through switch 214. Latch 216, in response to the signal pulse, changes logical state, such that negative output 222 has a logical "0" imposed thereon, and positive output 218 has a logical "1" imposed thereon. In response to latch 216 changing state, switch 214 opens, and switch 212 closes. When pulse generator 206 generates the next negative pulse on signal path 208, the pulse propagates to latch 216 through switch 212. Latch 216, in response to the pulse, changes logical state, such that negative output 222 has a logical "1" imposed thereon, and positive output 218 has a logical "0" imposed thereon. In response to latch 216 changing state, switch 212 opens, and switch 214 closes. This process continues for as long as an input signal is applied, resulting in an output signal having a frequency substantially one half of the frequency of the input signal.

Frequency divider circuit 200 has been described with reference to specific logical polarities. For example, pulse generator 206 has been described as a pulse generator that produces negative signal pulses, and switches 212 and 214 have been described as switches that are closed when the corresponding control input has a logical "1" imposed thereon. One skilled in the art will understand that a choice of polarities exists, such that opposite logical polarities of signal pulses and control signals can be utilized while still practicing the present invention.

Figure 3:
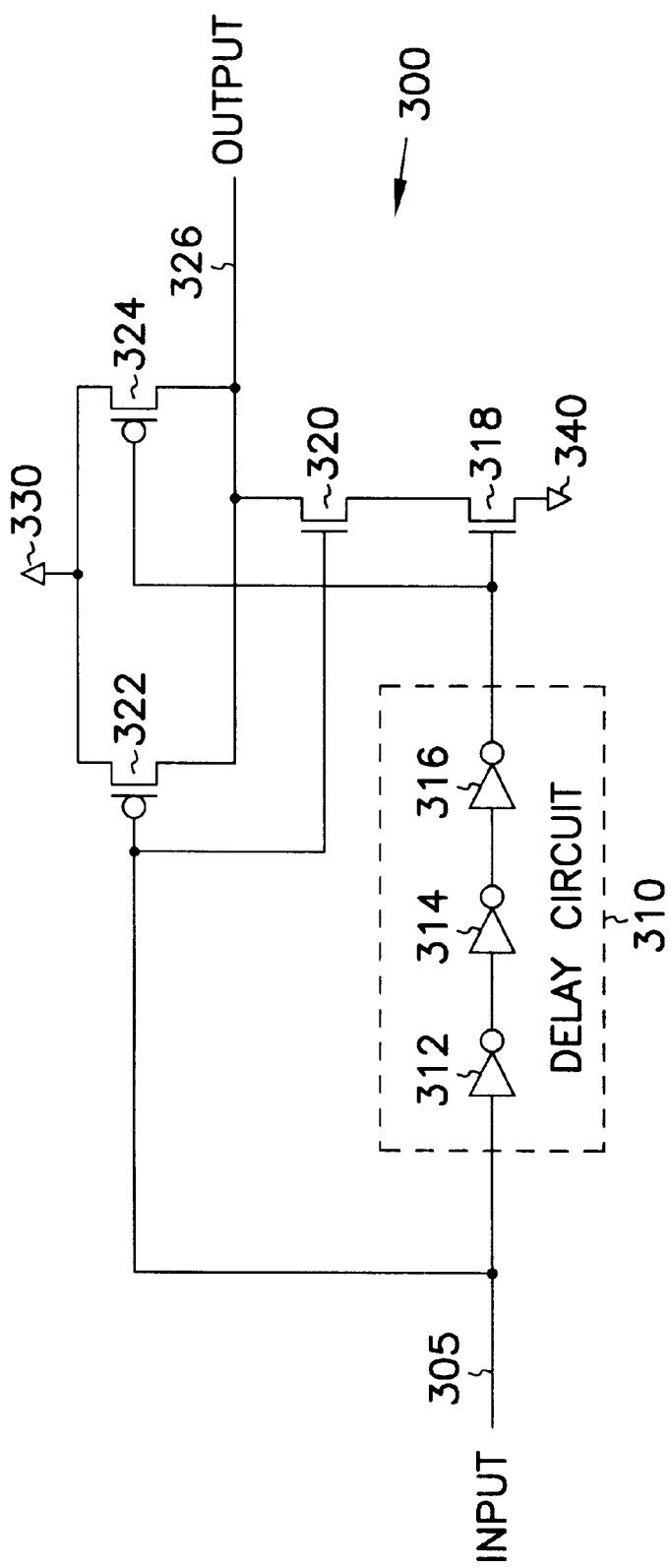
FIG. 3 is a diagram of a pulse generator.

FIG. 3 shows a diagram of a pulse generator. Pulse generator 300 includes delay circuit 310 and transistors 318, 320, 322, and 324. Pulse generator 300 also includes input node 305, output node 326, power node 330, and reference node 340. Delay circuit 310 includes inverters 312, 314, and 316. A signal on input node 305 propagates through the inverters within delay circuit 310, and emerges delayed and inverted. Other types of delay circuits can be utilized within delay circuit 310; inverters 312, 314, and 316 being shown for explanatory purposes only. Transistors 318, 320, 322, and 324 are known as pass transistors. When the appropriate signal polarity is applied to the gate of a pass transistor, the transistor is on. Likewise, when the opposite polarity is applied, the transistor is off. As shown in FIG. 3, transistors 322 and 324 are on when a negative polarity is applied to their gates, and transistors 318 and 320 are on when a positive polarity is applied to their gates.

In operation, when a signal impressed on input node 305 is in a steady-state low voltage condition, transistor 322 is on and transistor 320 is off, thereby allowing output node 326 to be coupled to power node 330. As a result, when input node 305 is in a steady-state low voltage condition, output node 326 is in a steady-state high voltage condition. When the signal impressed on input node 305 is in a steady-state high voltage condition, transistor 324 is on and transistor 318 is off. As a result, when input 305 is in a steady-state low voltage condition, output node 326 is in a steady-state high voltage condition. One can see, therefore, that pulse generator 300 produces a steady-state high voltage at output node 326 for any steady-state input.

When a signal impressed on input node 305 transitions from a low voltage to a high voltage, a negative pulsed signal is produced on output node 326, where the width of the negative pulse is determined in part by the time delay through delay circuit 310. This operation of pulse generator 300 in response to a rising edge input is now described. As previously stated, when the input is in a steady-state low voltage condition, the output is in a steady-state high condition. Prior to the signal impressed on input node 305 transitioning from low voltage to high voltage, transistors 322 and 318 are on, and transistors 324 and 320 are off. When the input signal transitions from low voltage to high voltage, transistors 322 and 320 change state before transistors 324 and 318 by virtue of delay circuit 310 in the signal path prior to transistors 324 and 318. During the time that the rising edge is propagating through delay circuit 310, transistors 322 and 324 are off, and transistors 320 and 318 are on, causing output node 326 to be coupled to reference node 340. As a result, the signal on output node 326 is low. After the delay time of delay circuit 310 has passed, the output of delay circuit 310 changes state, thereby causing transistors 324 and 318 to also change state. Pulse generator 300 is then in the steady-state condition with both input node 305 and output node 326 high as described above.

When the input signal transitions from a high voltage to a low voltage, the output signal remains in the steady-state high voltage condition, as is now explained. Prior to the signal impressed on input node 305 transitioning from a high voltage to a low voltage, transistors 322 and 318 are off, and transistors 324 and 320 are on. When the input signal transitions from a high voltage to a low voltage, transistors 322 and 320 change state before transistors 324 and 318, by virtue of delay circuit 310 in the signal path prior to transistors 324 and 318. During the time that the rising edge is propagating through delay circuit 310, transistors 322 and 324 are on, and transistors 320 and 318 are off, causing output node 326 to remain coupled to power node 330. As a result, the signal on output node 326 remains high. After the delay time of delay circuit 310 has passed, the output of delay circuit 310 changes state, thereby causing transistors 324 and 318 to change state. Pulse generator 300 is then in the steady-state condition with input node 305 at a low voltage and output node 326 at a high voltage as described above.

One skilled in the art will understand that modifications to pulse generator 300 can be made such that signal pulses are generated in response to a falling edge of an input signal, or such that positive signal pulses can be generated instead of negative signal pulses. These modifications, and others understood by those skilled in the art, can be made while still practicing the present invention.

Figure 4:
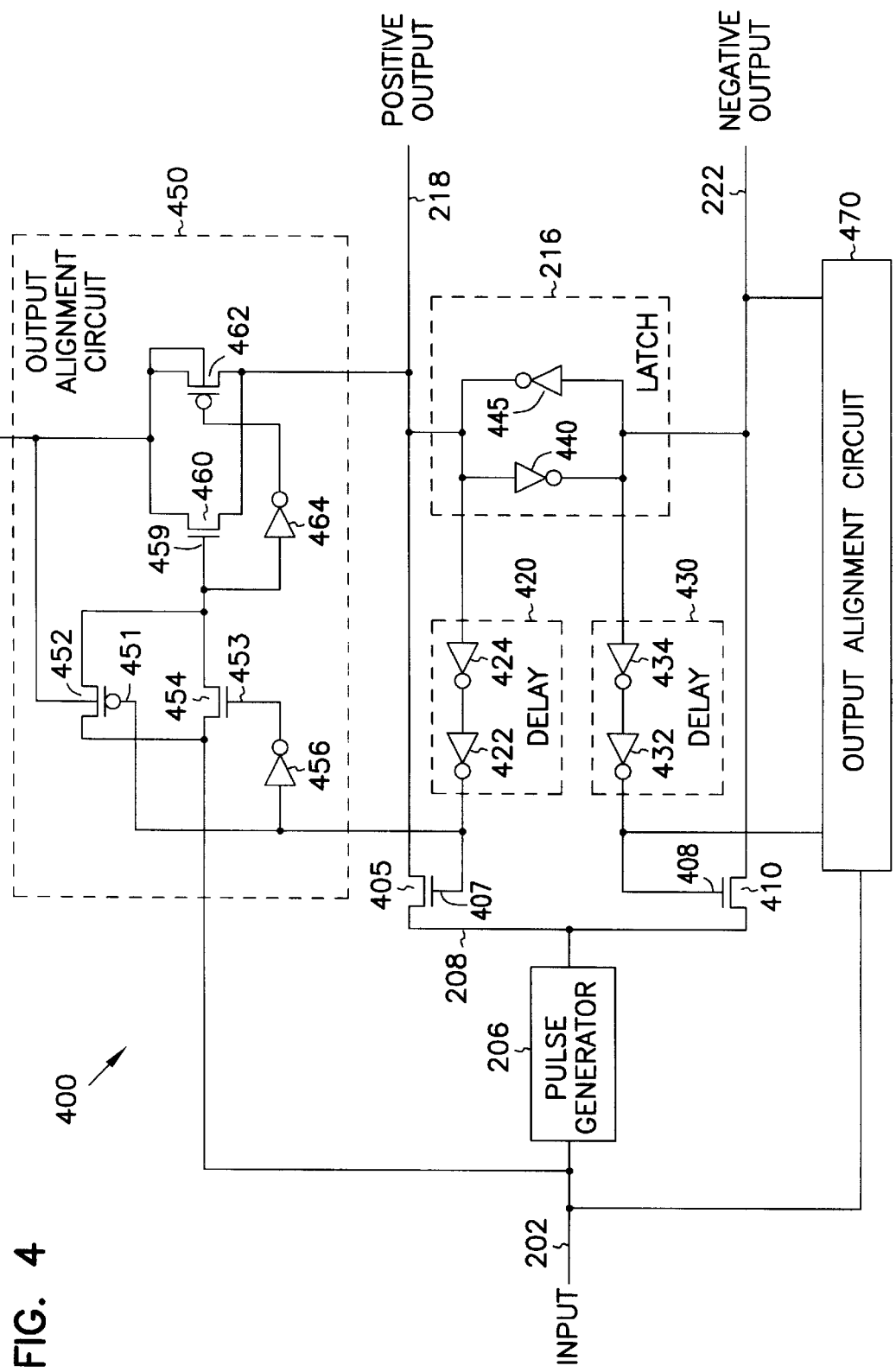
FIG. 4 is a more detailed diagram of a frequency divider circuit.

FIG. 4 shows an alternate embodiment of a frequency divider circuit. Frequency divider circuit 400 includes pulse generator 206, latch 216, delay circuits 420 and 430, and transistors 405 and 410. Frequency divider circuit 400 also includes output alignment circuits 450 and 470. Latch 216 includes two cross-coupled inverters 440 and 445. Delay circuit 420 includes inverters 422 and 424, and delay circuit 430 includes inverters 432 and 434.

When the output node of pulse generator 206 is coupled to latch 216, a negative signal pulse applied to latch 216 can overcome the drive strength of an inverter and switch the logical state of the latch. For example, when latch 216 is storing a logical "0," positive output 218 is driven to a low voltage by inverter 445, and negative output 222 is driven to a high voltage by inverter 440. Also when latch 216 is storing a logical "0," transistor 405 is off by virtue of gate 407 being at a low voltage, and transistor 408 is on by virtue of gate 410 being at a high voltage.

When pulse generator 206 produces a negative pulsed signal in response to a rising edge of an input signal on input node 202, the negative pulse is coupled to the input of inverter 445, and to the output of inverter 440. The drive strength of pulse generator 206 overcomes the drive strength of inverter 440, and the latch changes logical state as a result. After changing logical state, latch 216 stores a logical "1," with positive output 218 being at a high voltage, and negative output 222 being at a low voltage. After latch 216 changes state, and after the logical "1" propagates from positive output 218 to gate 407, transistor 405 turns on. Likewise, after the logical "0" propagates from negative output 222 to gate 408, transistor 410 turns off. The next negative signal pulse produced by pulse generator 206 is then coupled to the output of inverter 445 and the input of inverter 440, and latch 216 changes logical state from "1" back to "0." For every negative signal pulse produced by pulse generator 206 thereafter, the process repeats and latch 216 changes state.

When latch 216 changes logical state, one of positive output 218 and negative output 222 change from a high voltage to a low voltage, and the other changes from a low voltage to a high voltage. The output that changes to a low voltage does so rapidly in part because the output of pulse generator 206 is coupled to the output transitioning low. For example, when latch 216 is storing a logical "0," negative output 222 has a high voltage impressed thereon, and negative output 222 is coupled to the output of pulse generator 206 by virtue of transistor 410 being on. When pulse generator 206 produces a negative signal pulse, negative output 222 transitions from a high voltage to a low voltage relatively quickly. When negative output 222 is transitioning from a high voltage to a low voltage, positive output 218 is transitioning from a low voltage to a high voltage. While negative output 222 is changing to a low voltage, it is driven by the negative signal pulse on the output of pulse generator 206, and is also driven by the output of inverter 440 after it changes state. At the same time, positive output 218 is driven only by the output of inverter 445. Because negative output 222 has the output of pulse generator 206 driving a low voltage in addition to inverter 440 driving a low voltage, it can transition from a high voltage to a low voltage faster than positive output 218 can transition from a low voltage to a high voltage.

Output alignment circuit 450 offers additional drive strength to positive output 218 when positive output 218 is transitioning from a low voltage to a high voltage. This is accomplished by coupling power node 480 to positive output 218 when positive output 218 is transitioning from a low voltage to a high voltage. By coupling power node 480 to positive output 218, positive output 218 is driven to a high voltage faster than if power node 480 were not coupled thereto.

In operation, when latch 216 is storing a logical "0," positive output 218 is at a low voltage, as is gate 407 of transistor 405. Within output alignment circuit 450, gate 451 of transistor 452 and the input of inverter 456 are also at a low voltage. As a result, transistors 452 and 454 are on. When an input signal impressed on input node 202 transitions from a low to a high voltage, the input signal propagates through transistors 452 and 454 to gate 459 of transistor 460, and to the input of inverter 464. As a result, transistors 460 and 462 turn on, thereby coupling power node 480 to positive output 218.

After positive output 218 transitions to a high voltage, the logical "1" corresponding thereto propagates through delay circuit 420. After propagating through inverters 422 and 424 of delay circuit 420, the resulting high voltage on the input of inverter 456 and on gate 451 of transistor 452 turn off transistors 452 and 454. Output alignment circuit 470 is the same as output alignment circuit 450 with the exception that output alignment circuit 470 couples negative output 222 to power node 480 when negative output 222 is transitioning from a low voltage to a high voltage.

Figure 5:
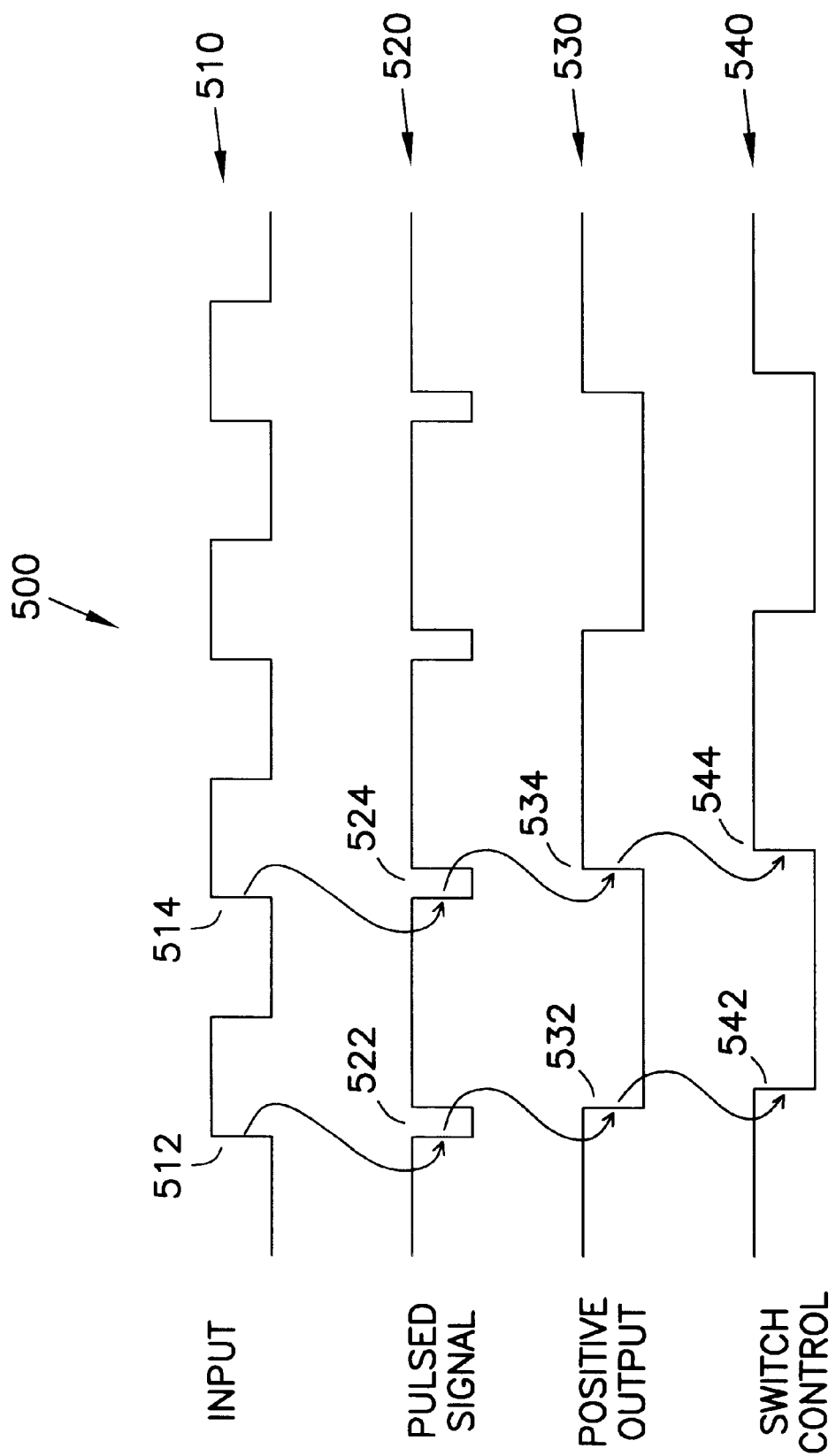
FIG. 5 is a timing diagram showing the operation of a frequency divider circuit.

FIG. 5 is a timing diagram showing the operation of a frequency divider circuit such as frequency divider circuit 400 shown in FIG. 4. Signal 510 is an input signal which is typically impressed in input node 202. Pulsed signal 520 is output by pulse generator 206. As shown in FIG. 5, negative pulses 522 and 524 on pulsed signal 520 are a result of rising edges 512 and 514, respectively. Positive output signal 530 corresponds to a signal produced on positive output 218. Falling edge 532 and rising edge 534, both on positive output signal 530, result from latch 216 changing logical state due to negative pulses 522 and 524, respectively. Switch control signal 540 corresponds to the signal present on gate 407 of transistor 405. This signal is a delayed version of positive output signal 530, where edges 542 and 544 trail edges 532 and 534 respectively, by an amount of time equal to the delay present in delay circuit 420.

Figure 6:
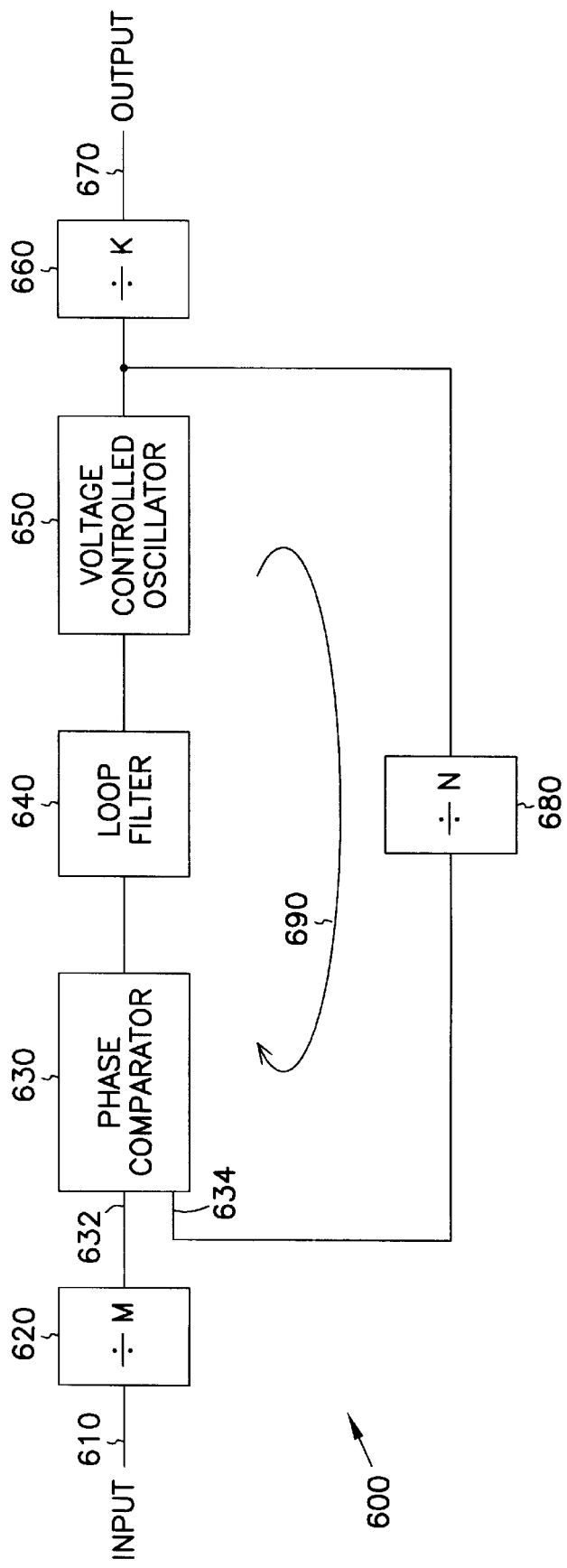
FIG. 6 is a phase lock loop circuit.

FIG. 6 shows a phase lock loop circuit that includes at least one frequency divider. Phase lock loop circuit 600 includes phase comparator 630, loop filter 640, voltage controlled oscillator (VCO) 650, and frequency dividers 620, 660, and 680. Phase lock loop circuit 600 receives an input signal on input node 610. Frequency divider 620 divides the frequency of the input by M, where M is an integer. Frequency divider 620 can be included in phase lock loop if an input signal of a lower frequency is desired. Phase comparator 630 has as inputs node 632 and node 634. Node 634 has a signal impressed thereon, where the signal is either the input signal or the output of frequency divider 620. Node 634 has a signal impressed thereon, where the signal is output from either frequency divider 680, or VCO 650.

In operation, phase comparator 630 compares the phase of the two signals on nodes 632 and 634, and outputs a voltage proportional to the difference. Loop filter 640 filters the phase comparator output and drives VCO 650. The output of VCO 650 drives output node 670 and node 634, which is one input to phase comparator 630. Alternatively, frequency divider 660 can be driven by VCO 650, and frequency divider 660 can drive output node 670. Loop 690 within phase lock loop 600 can also include frequency divider 680, in which case VCO 650 drives frequency divider 680, which in turn drives node 634. Frequency dividers 620, 660, and 680 can each be one of many different types of frequency dividers, including those shown in FIGS. 2 and 4, and described with reference thereto.

Figure 7:
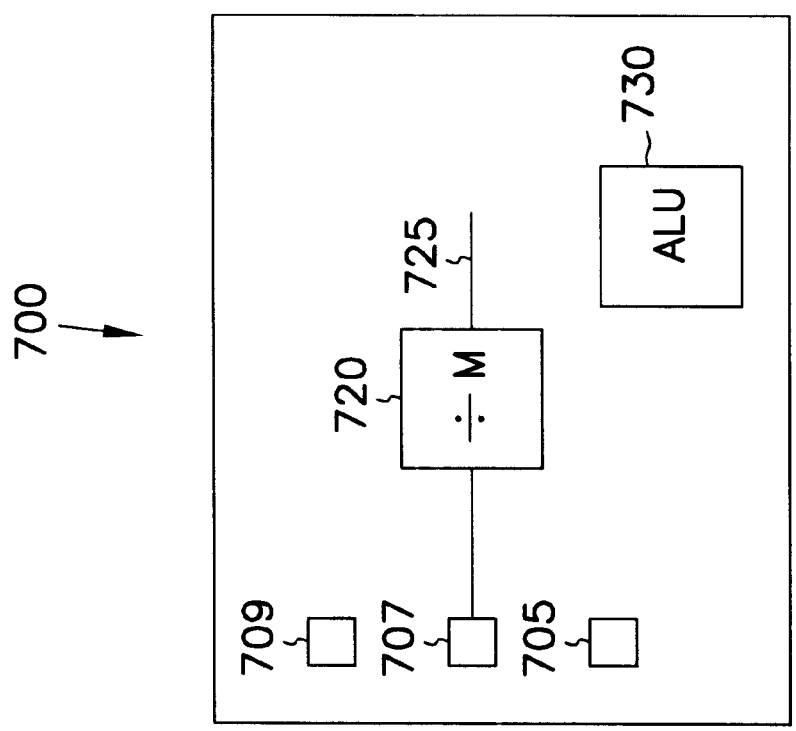
FIG. 7 is an integrated circuit.

FIG. 7 shows an integrated circuit which includes a frequency divider. Integrated circuit 700 includes input nodes 705, 707, and 709, Arithmetic Logic Unit (ALU) 730, and frequency divider 720. Frequency divider 720 can be one of many different types of frequency dividers, including those shown in FIGS. 2 and 4, and described with reference thereto. In one embodiment, integrated circuit 700 is a processor such as a microprocessor, digital signal processor, microcontroller, or the like. In this embodiment, ALU 730 performs arithmetic functions, and frequency divider 720 divides the frequency of a signal in the processor. The signal being divided in frequency may be one that is input to the processor through an input node, or may be one that is generated internal to the processor. Likewise, the signal generated by frequency divider 720 may be used internally by the processor, or may exit the processor.

In another embodiment, integrated circuit 700 is a circuit other than a processor, such as an Application Specific Integrated Circuit (ASIC). Frequency divider 720 can divide the frequency of signals entering integrated circuit 700, or can divide the frequency of signals generated within integrated circuit 700. When dividing the frequency of a signal entering integrated circuit 700, a signal enters integrated circuit 700 through input node 707. The signal then enters frequency divider 720, and is divided in frequency by M. For example, if the input signal has a frequency of N, the signal produced by frequency divider 720 on node 725 would have a frequency of N divided by M. Frequency divider 720 within integrated circuit 700 has many uses, including the frequency division of a clock signal entering integrated circuit 700.

Figure 8:
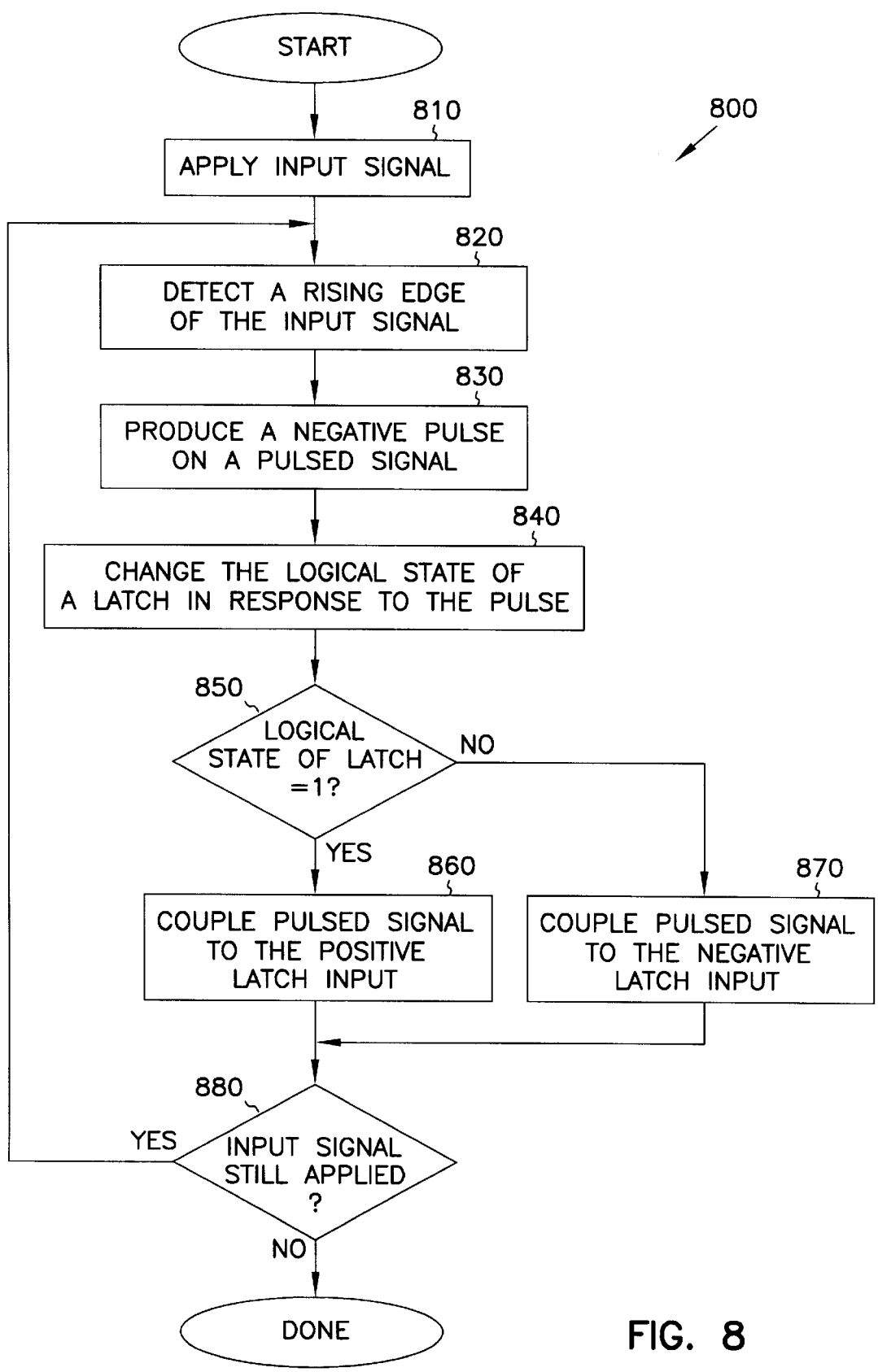
FIG. 8 is a flowchart of a method of frequency dividing a signal.

FIG. 8 shows a flowchart of a method of dividing the frequency of a signal. Method 800 begins with action box 810 when an input signal is applied. In action box 820, a rising edge of the input signal is detected. This can be accomplished with a pulse generator such as pulse generator 300 (FIG. 3) or pulse generator 206 (FIG. 4). For the purpose of explanation, action box 820 specifies the detection of a rising edge. One skilled in the art will understand that action box 820 can detect a falling edge while still practicing the present invention.

In action box 830, a negative pulse is produced on a pulsed signal. The negative pulse can be produced by a pulse generator such as pulse generator 300 (FIG. 3) or pulse generator 206 (FIG. 4). In the embodiment shown in FIG. 8, one negative pulse is generated for each rising edge of the input signal. Although action box 830 specifies a negative pulse, one skilled in the art will appreciate that positive pulses can be produced while still practicing the present invention.

In action box 840, the logical state of a latch is changed in response to the pulse on the pulsed signal. The latch can be a pair of cross-coupled inverters such as inverters 440 and 445 in latch 216 (FIG. 4). In decision box 850, the logical state of the latch is tested. If the logical state is a "1," then the pulsed signal is coupled to a positive latch input in action box 860. If the logical state is not a "1," then the pulsed signal is coupled to a negative latch input. By conditionally coupling the pulsed signal to different latch inputs as a function of the logical state of the latch, the latch can be made to repeatedly change state.

In decision block 880, a test is performed to check if the input signal is still applied. If so, then processing repeats starting with action box 820. If not, method 800 ends. One traverse through method 800 corresponds to a single period of the input signal; each time through the loop one rising edge of the input signal is detected. Likewise, one traverse of the loop corresponds to one half of one period on the output signal.

Conclusion

A frequency divider and method have been described. The frequency divider includes a pulse generator and a latch with differential outputs. The latch changes logical state in response to signal pulses produced by the pulse generator. The signal pulses are produced by the pulse generator in response to rising edges of an input signal applied to the pulse generator. A first output alignment circuit provides additional drive strength to a first of the differential outputs when it is transitioning high. A second output alignment circuit provides additional drive strength to a second of the differential outputs when it is transitioning high.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A frequency divider comprising:
   a pulse generator having an input node coupled to an input of the frequency divider, and having an output node, wherein the pulse generator is configured to provide signal pulses on the output node;
   a first switch coupled between the output node of the pulse generator and a first frequency divider output node, the first switch having a first control input node;
   a second switch coupled between the output node of the pulse generator and a second frequency divider output node, the second switch having a second control input node; and
   a latch coupled between the first and second frequency divider output nodes;
   a first delay element coupled between the first frequency divider output node and the first control input node; and
   a second delay element coupled between the second frequency divider output node and the second control input node.

2. The frequency divider of claim 1 wherein the pulse generator is configured to:
   receive on the input node an input signal having a plurality of periods, each period having a rising edge and a falling edge; and
   generate one signal pulse for each of the plurality of periods.

3. The frequency divider of claim 1 wherein the latch is comprised of cross-coupled inverters.

4. The frequency divider of claim 1 further comprising:
   a first output alignment circuit coupled between the input of the frequency divider and the first frequency divider output node, the first output alignment circuit being configured to provide fast rising edge signals on the first frequency divider output node.

5. The frequency divider of claim 4 wherein the first output alignment circuit is configured to be responsive to a signal on the first control input node.

6. The frequency divider of claim 4 wherein the first output alignment circuit includes a transistor to couple the first frequency divider output node to a power node when a signal on the first frequency divider output node transitions from a low voltage to a high voltage.

7. A frequency divider comprising:
   a pulse generator having an input node coupled to an input of the frequency divider, and having an output node, wherein the pulse generator is configured to provide signal pulses on the output node;
   a latch coupled to the output node of the pulse generator, wherein the latch has a logical state, and is configured to change logical state in response to the signal pulses;
   a differential output comprised of a first divider output node and a second divider output node, the latch being disposed therebetween; and
   a first switch coupled between the output node of the pulse generator and the first divider output node, the first switch being controlled by the logical state of the latch.

8. The frequency divider of claim 7 further comprising a second switch coupled between the output node of the pulse generator and the second divider output node, the second switch being controlled by the logical state of the latch.

9. The frequency divider of claim 8 wherein the first switch and the second switch are controlled by opposite logical states of the latch such that when in steady-state, one of the first switch and second switch is on, and the other is off.

10. The frequency divider of claim 7 further comprising a first output-alignment circuit coupled between the frequency divider input and the first divider output node, wherein the first output-alignment circuit is configured to provide fast rising edges on signals on the first divider output node.

11. The frequency divider of claim 10 wherein the first output alignment circuit includes a transistor to couple the first divider output node to a power node when a signal on the first divider output node transitions from a low voltage to a high voltage.

12. A frequency divider comprising:
   a pulse generator having an input node coupled to an input of the frequency divider, and having an output node, wherein the pulse generator is configured to provide signal pulses on the output node;
   a latch coupled to the output node of the pulse generator, wherein the latch has a logical state, and is configured to change logical state in response to the signal pulses;
   a differential output comprised of a first divider output node and a second divider output node, the latch being disposed therebetween; and
   a first output-alignment circuit coupled between the frequency divider input and the first divider output node, wherein the first output-alignment circuit is configured to provide fast rising edges on signals on the first divider output node.

13. The frequency divider of claim 12 further comprising a second output-alignment circuit coupled between the frequency divider input and the second divider output node, wherein the second output-alignment circuit is configured to provide fast rising edges on signals on the second divider output node.

14. The frequency divider of claim 13 further comprising a first switch coupled between the output node of the pulse generator and the first divider output node, the first switch having a first control input node influenced by the first divider output node.

15. The frequency divider of claim 14 wherein the first output alignment circuit includes a transistor to couple the first divider output node to a power node when a signal on the first divider output node transitions from a low voltage to a high voltage.

16. The frequency divider of claim 14 further comprising a second switch coupled between the output node of the pulse generator and the second divider output node, the second switch having a second control input node influenced by the second divider output node.

17. The frequency divider of claim 16 wherein the first output alignment circuit includes a transistor to couple the first divider output node to a power node when a signal on the first divider output node transitions from a low voltage to a high voltage.

18. A phase lock loop comprising:
   a phase comparator coupled to an input of the phase lock loop;
   an oscillator responsive to the phase comparator; and
   a frequency divider comprising:
      a pulse generator;
      a latch, wherein the latch is configured to change a logical state in response to signal pulses produced by the pulse generator;
      at least one output coupled to the latch; and
      a switch coupled between an output of the pulse generator and the at least one output, the switch having a control input, wherein the control input of the switch is responsive to the logical state of the latch.

19. The phase lock loop of claim 18 wherein the frequency divider is coupled between the input of the phase lock loop and an input of the phase comparator.

20. The phase lock loop of claim 18 wherein the frequency divider is coupled between an output of the oscillator and an output of the phase lock loop.

21. The phase lock loop of claim 18 wherein the frequency divider is coupled between an output of the oscillator and an input of the phase comparator.

22. The phase lock loop of claim 18 further comprising a first output-alignment circuit coupled between an input of the frequency divider and the at least one output, wherein the first output-alignment circuit is configured to provide fast rising edges on signals on the at least one output.

23. The phase lock loop of claim 22 wherein the first output alignment circuit includes a transistor to couple the at least one output to a power node when a signal on the at least one output transitions from a low voltage to a high voltage.

24. An integrated circuit comprising:
   an input node configured to receive an input signal having a frequency and a plurality of periods; and
   a frequency divider for dividing the frequency of the input signal, the frequency divider comprising:
      a pulse generator configured to produce a pulsed signal having one pulse for each of the plurality of periods;
      a latch having a logical state, the latch being configured to change the logical state in response to each pulse on the pulsed signal;
      at least one output coupled to the latch; and
      a switch coupled between an output of the pulse generator and the at least one output, the switch having a control input, wherein the control input of the switch is responsive to the logical state of the latch.

25. The integrated circuit of claim 24 wherein the frequency divider further comprises a delay element coupled between the at least one output and the control input of the switch.

26. The integrated circuit of claim 24 wherein:
   the at least one output comprises a first divider output node and a second divider output node;
   the switch is coupled between the output of the pulse generator and the first divider output node; and
   the latch is disposed between the first divider output node and the second divider output node.

27. The integrated circuit of claim 26 further comprising:
   a second switch coupled between the output of the pulse generator and the second divider output node, the second switch having a control input; and
   a delay element coupled between the second divider output node and the control input of the second switch.

28. A frequency divider circuit comprising:
   a pulse generator configured to receive an input signal having a frequency and a plurality of periods; and configured to produce a pulsed signal on an output node, the pulsed signal having a pulse thereon for each of the plurality of periods;
   a latch coupled to the output node of the pulse generator, the latch having a logical state, the latch being configured to receive the pulsed signal on either of a first output node or second output node of the frequency divider circuit;
   a first switch coupled between the output node of the pulse generator and the first output node of the frequency divider circuit, the first switch being either open or closed as a function of the logical state of the latch;
   a second switch coupled between the output node of the pulse generator and the second output node of the frequency divider circuit, the second switch being either open or closed as a function of the logical state of the latch;
   a first output alignment circuit coupled between an input of the frequency divider circuit and the first output node of the frequency divider circuit, the first output alignment circuit being configured to provide fast rising edge signals on the first output node of the frequency divider circuit; and
   a second output alignment circuit coupled between the input of the frequency divider circuit and the second output node of the frequency divider circuit, the second output alignment circuit being configured to provide fast rising edge signals on the second output node of the frequency divider circuit.

29. The frequency divider circuit of claim 28 wherein the first output alignment circuit includes a transistor to couple the first output node of the frequency divider circuit to a power node when a signal on the first output node of the frequency divider circuit transitions from a low voltage to a high voltage.

* * * * *